US009844736B1

(12) United States Patent
Roberts et al.

(10) Patent No.: US 9,844,736 B1
(45) Date of Patent: *Dec. 19, 2017

(54) PROTECTIVE ENCLOSURE FOR MODEL VEHICLE

(71) Applicant: TRAXXAS LP, McKinney, TX (US)

(72) Inventors: Timothy E. Roberts, Erie, CO (US); Jon Kenneth Lampert, Allen, TX (US); Otto Karl Allmendinger, Rowlett, TX (US)

(73) Assignee: TRAXXAS LP, McKinney, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/642,472

(22) Filed: Mar. 9, 2015

Related U.S. Application Data

(63) Continuation of application No. 13/649,777, filed on Oct. 11, 2012, now Pat. No. 8,976,511, which is a
(Continued)

(51) Int. Cl.
A63H 17/26 (2006.01)
H05K 5/00 (2006.01)
(Continued)

(52) U.S. Cl.
CPC ............ A63H 17/26 (2013.01); A63H 29/24 (2013.01); H01R 4/2429 (2013.01); H05K 5/069 (2013.01); H05K 5/00 (2013.01)

(58) Field of Classification Search
CPC ........ A63H 17/26; A63H 29/24; H05K 5/069; H01R 4/2429
(Continued)

(56) References Cited

U.S. PATENT DOCUMENTS 3,187,462 A * 6/1965 Gunars ................. A63H 17/00
200/501
3,354,454 A * 11/1967 Rueger ..................... F21S 8/00
174/559
(Continued)

FOREIGN PATENT DOCUMENTS

DE 10151413 A1 7/2003
DE 102005061050 A1 6/2007
(Continued)

OTHER PUBLICATIONS

*Traxxas LP v. Hobby Shack d/b/a Global Hobby Distributors*, Case No. 2:14-cv-00081, U.S. Dist.Ct. Eastern Div. Texas, Marshall Div.; "Defendant Hobby Shack'S Patent Rule 3-3 and 3-4 Disclosure of Invalidity Contentions"; Jul. 30, 2014.
(Continued)

*Primary Examiner* — Alexander Niconovich
(74) *Attorney, Agent, or Firm* — Daryl R. Wright; Greg Carr

(57) ABSTRACT

The present invention provides for a protective enclosure comprising a base comprising a first continuous mating surface and at least one conveyance aperture, a cover comprising a second continuous mating surface, wherein the second continuous mating surface is configured to form a seal with the first continuous mating surface, and a clamp, wherein at least a portion of the clamp is coupleable to the base, wherein a mouth of the clamp is configured to be offset from the aperture when the clamp is coupled to the base, wherein the clamp comprises a first sealing layer, and wherein the clamp is configured to seal the aperture against contaminants. The protective enclosure may be configured for use in a remotely controllable model vehicle to protect a control module.

18 Claims, 7 Drawing Sheets

Related U.S. Application Data continuation of application No. 11/872,872, filed on Oct. 16, 2007, now Pat. No. 8,315,040.

(51) Int. Cl.
  *H01R 4/24* (2006.01)
  *H05K 5/06* (2006.01)
  *A63H 29/24* (2006.01)

(58) Field of Classification Search
  USPC ............... 446/78, 269, 431, 439, 470, 484; 361/622, 679.01, 679.4, 679.58, 725, 728
  See application file for complete search history.

(56) References Cited

U.S. PATENT DOCUMENTS

| | | | | |
|---|---|---|---|---|
| 3,879,255 A * | 4/1975 | Mason | ............... | E04F 21/00 156/527 |
| 3,994,555 A * | 11/1976 | Konno | ............... | H01R 13/516 439/345 |
| 4,225,655 A * | 9/1980 | Pesce | ............... | H01M 2/1072 206/811 |
| 4,394,692 A * | 7/1983 | Randmae | ............... | H04N 5/2252 348/143 |
| 4,533,201 A * | 8/1985 | Wasserlein, Jr. | ............... | H01R 4/2429 439/391 |
| 4,698,459 A * | 10/1987 | Drake | ............... | H01R 11/284 174/138 F |
| 4,850,884 A * | 7/1989 | Sawai | ............... | B60R 16/0239 361/752 |
| 5,009,612 A * | 4/1991 | Rishworth | ............... | H01R 12/616 439/403 |
| 5,088,010 A * | 2/1992 | Wimmer | ............... | G08G 1/095 174/45 R |
| 5,317,462 A * | 5/1994 | Kakizaki | ............... | G11B 33/1466 174/564 |
| 5,394,208 A * | 2/1995 | Campbell | ............... | G03B 29/00 348/E5.026 |
| 5,588,856 A * | 12/1996 | Collins | ............... | H01R 13/5208 439/204 |
| 5,833,486 A * | 11/1998 | Shinozaki | ............... | H01R 12/675 439/404 |
| 5,911,594 A * | 6/1999 | Baker, III | ............... | H01R 13/6463 439/404 |
| 5,971,792 A * | 10/1999 | Lin | ............... | H01R 43/01 439/404 |
| 6,315,596 B1 * | 11/2001 | Chen | ............... | H01R 4/2433 439/417 |
| 6,328,592 B1 * | 12/2001 | Burke | ............... | H01R 4/2429 439/404 |
| 6,362,421 B1 * | 3/2002 | Layton, Jr. | ............... | H02G 3/081 174/50 |
| 6,364,736 B1 * | 4/2002 | Lee | ............... | A63H 17/12 446/431 |
| 6,572,395 B1 * | 6/2003 | Burlew | ............... | H01R 13/5219 439/198 |
| 6,575,809 B2 * | 6/2003 | Ogawa | ............... | A63H 18/00 446/429 |
| 6,602,089 B2 * | 8/2003 | Abe | ............... | H01R 12/675 29/854 |
| 7,377,295 B2 * | 5/2008 | Byers | ............... | A63H 17/262 141/350 |
| 7,402,073 B2 * | 7/2008 | Yotsutani | ............... | H01R 13/6585 439/394 |
| 7,497,757 B2 * | 3/2009 | Hamasaki | ............... | A63H 17/05 446/434 |
| 7,762,415 B2 * | 7/2010 | Matsui | ............... | H02G 3/088 174/58 |
| 7,762,731 B2 * | 7/2010 | Arbuckle | ............... | G03B 17/08 277/628 |
| 7,835,634 B2 * | 11/2010 | Berend | ............... | G03B 17/08 396/25 |
| 8,026,443 B1 * | 9/2011 | Czarnecki | ............... | H02G 3/085 174/50 |
| 8,315,040 B2 | 11/2012 | Roberts et al. | | |
| 8,488,314 B1 * | 7/2013 | Ashcraft | ............... | G06F 1/1616 312/223.1 |
| 8,625,290 B2 * | 1/2014 | Wee | ............... | H05K 5/069 174/152 G |
| 8,976,511 B1 | 3/2015 | Roberts et al. | | |
| 8,982,541 B1 | 3/2015 | Roberts et al. | | |
| 2002/0079653 A1 * | 6/2002 | Noguchi | ............... | H05K 5/061 277/628 |
| 2009/0097191 A1 | 6/2009 | Roberts et al. | | |
| 2009/0302034 A1 * | 12/2009 | Makela; Keijo | ............... | H02G 3/0658 220/3.8 |
| 2011/0057778 A1 | 3/2011 | Dewitt et al. | | |
| 2011/0059760 A1 | 3/2011 | DeWitt et al. | | |
| 2011/0063090 A1 | 3/2011 | DeWitt et al. | | |
| 2015/0131241 A1 * | 5/2015 | Sprowl | ............... | A63H 29/22 361/752 |
| 2015/0270693 A1 | 9/2015 | Thornton | | |

FOREIGN PATENT DOCUMENTS

| | | |
|---|---|---|
| DE | 102009005716 A1 | 7/2010 |
| DE | 102012213200 A1 | 2/2013 |
| GB | 2115614 A | 9/1983 |
| JP | H02-98685 U | 8/1990 |

OTHER PUBLICATIONS

Traxxas LP; "VillainEX" photographs; May, 2003.
Traxxas LP; "VillainEX Details" web brochure; May, 2003.
Traxxas LP; "VillainEX" photograph; May, 2003.
Traxxas LP; "VillainEX Model 1502 Owners Manual"; May, 2003.
Traxxas LP; "VillainEX Model 1502 Exploded Views"; May, 2003.
International Search Report by the ISA/EP, dated Nov. 25, 2014, re PCT Application No. PCT/US2014/044959.
Written Opinion of the ISA/EP, dated Nov. 25, 2014, re PCT Application No. PCT/US2014/044959.
Final Office Action, dated Nov. 28, 2016, by the USPTO, re U.S. Appl. No. 14/320,486.

\* cited by examiner

PROTECTIVE ENCLOSURE FOR MODEL VEHICLE

CROSS-REFERENCE TO RELATED APPLICATIONS

This application is a continuation of, and claims the benefit of the filing date of, co-pending U.S. patent application Ser. No. 13/649,777 entitled PROTECTIVE ENCLOSURE FOR MODEL VEHICLE, filed Oct. 11, 2012, which is a continuation of U.S. patent application Ser. No. 11/872,872, filed Oct. 16, 2007, now U.S. Pat. No. 8,315,040 entitled PROTECTIVE ENCLOSURE FOR MODEL VEHICLE, issued Nov. 20, 2012.

BACKGROUND OF THE INVENTION

Field of the Invention

The present invention relates to protective enclosures and, more particularly, to protective enclosures having provision for transverse conveyances.

Description of the Related Art

Remotely controllable model cars are generally designed to operate on land, and are often designed to be maintainable and modifiable by untrained users. Thus, control modules, including receiver electronics packages, electronic sensors and mechanical sensors, are typically susceptible to damage from contaminants such as water, mud, dirt and snow. A permanently sealed enclosure, which could protect a control module from contaminants while permitting a transverse conveyance, i.e. a wire or a tube passing from the inside to the outside, would complicate modification and repair by a typical user.

Assembly, modification and repair of a remotely controllable car may include the addition, removal and/or substitution of control modules, which may result in the use of a different number of wires and tubes entering a protective enclosure, as well as the use of wires and tubes of differing diameters. Consequently, there exists a need for a protective enclosure that protects a control module from contaminants while permitting transverse conveyances of differing sizes and varying numbers, and also retains its sealing properties, despite multiple episodes of opening and closing the enclosure.

SUMMARY OF THE INVENTION

The present invention provides protective enclosure that protects a control module from contaminants while permitting entry of transverse conveyances while retaining its sealing properties.

BRIEF DESCRIPTION OF THE DRAWINGS

For a more complete understanding of the present invention and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, specific details, and the like have been omitted inasmuch as such details are not considered necessary to obtain a complete understanding of the present invention, and are considered to be within the understanding of persons of ordinary skill in the relevant art.

Figure 1:
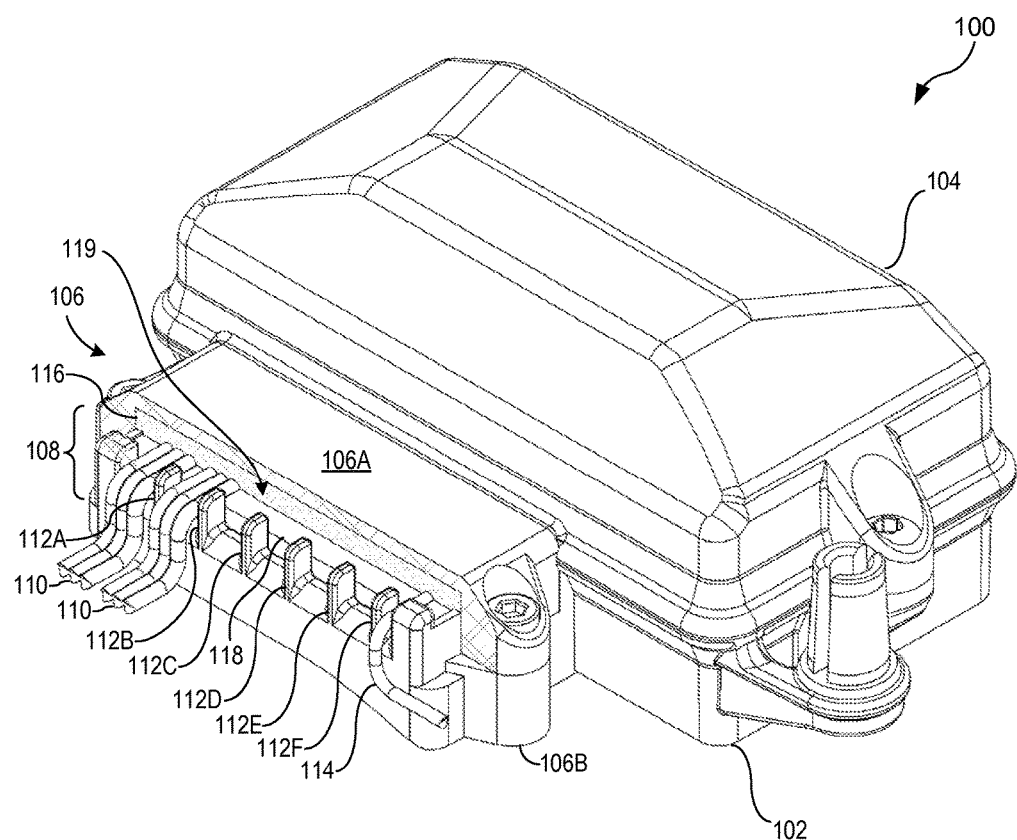
FIG. 1 illustrates a perspective view of an embodiment of a protective enclosure.

Turning now to FIG. 1, the reference numeral 100 generally indicates an embodiment of a protective enclosure. In the illustrated embodiment, protective enclosure 100 comprises a base 102, a cover 104 and a clamp 106. Clamp 106, which may provide strain relief to transverse conveyances, comprises a top portion 106a and a bottom portion 106b, and has a mouth 108, through which conveyances, such as ribbon cables 110 and a wire 114 may traverse the enclosure 100. It should be understood that enclosure 100 may comprise a single piece of material, in which, for example, clamp portions 106a and 106b are already connected to cover 104 and base 102, respectively, and cover 104 and base 102 are hinged. Alternatively, enclosure 100 may multiple pieces, in which, for example, base 102, cover 104, top clamp portion 106a and bottom clamp portion 106b comprise separate portions that are coupleable, i.e. configured to be assembled together. The embodiment illustrated in FIG. 1, however, shows bottom clamp portion 106b and base 102 as a single piece to which cover 104 and top clamp portion 106a are coupleable. It should be further understood that transverse conveyances may include tubes, such as vacuum hose, pressurized hose, or tubes encasing movable cables.

Enclosure 100, as illustrated, is configured to house a control device for a model vehicle, for example a remotely controllable model car, in an environment protected from contaminants, such as water, mud, dirt and snow. The control device may comprise an electronic module, such as a receiver, transmitter, sensor, switch or power supply, a mechanical module, such as a gear, lever or valve assembly, and/or an electromechanical module, such as a motor, generator, or mechanically operated electrical switch. Some embodiments of enclosure 100 may house multiple modules.

Figure 2:
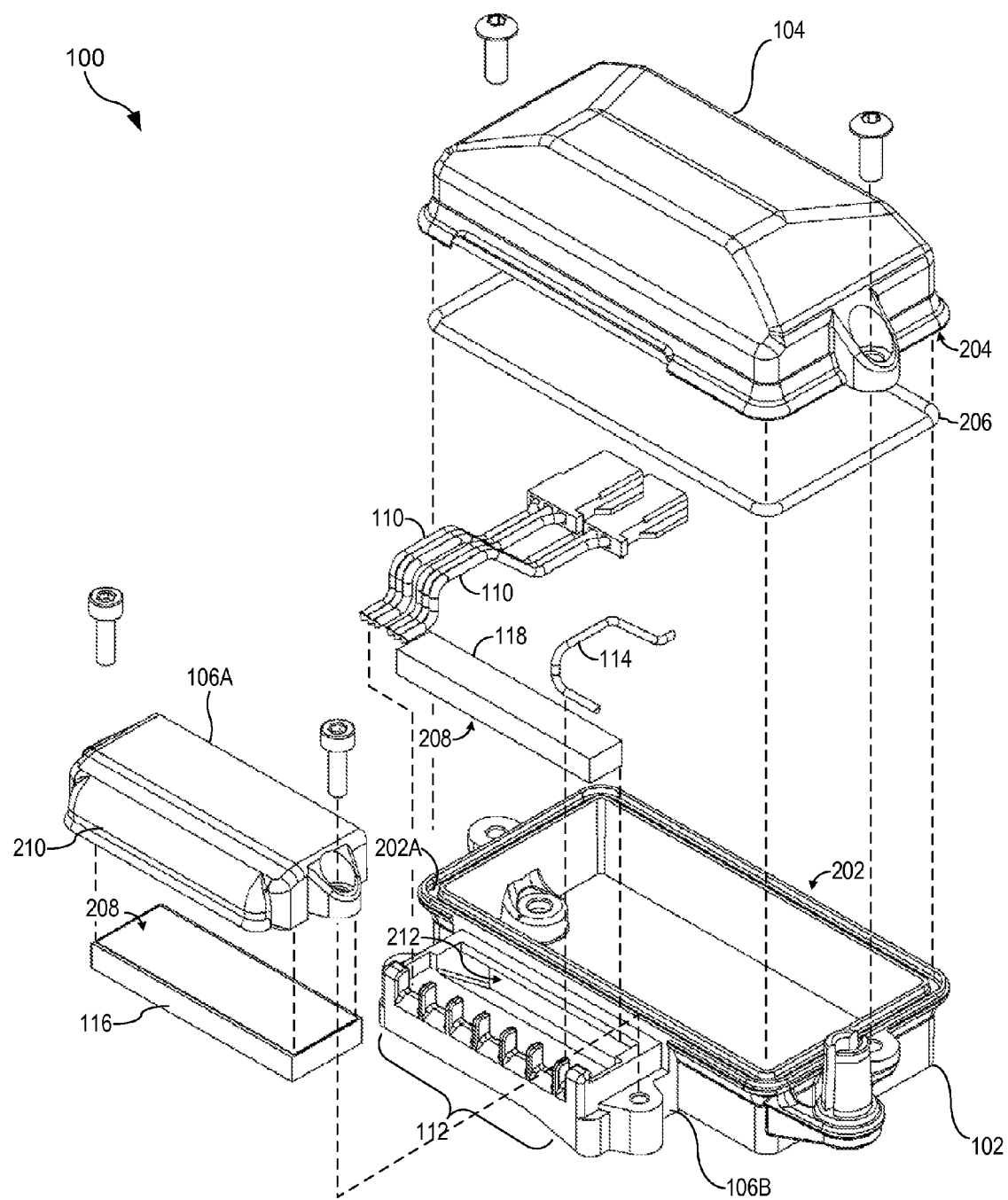
FIG. 2 illustrates an exploded assembly view of the protective enclosure of FIG. 1.
Figure 5:
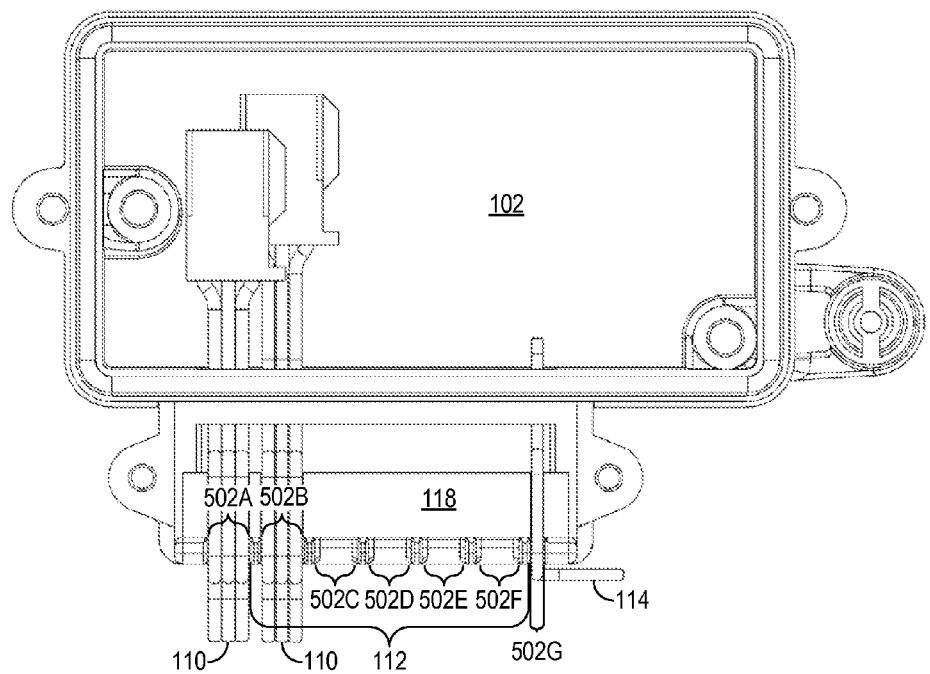
FIG. 5 illustrates a top interior view of the protective enclosure of FIG. 1.

FIG. 1 further illustrates conveyance alignment guides 112A-F adjacent to mouth 108 of clamp 106. In order to illustrate conveyance alignment guides 112A-F, enclosure 100 is illustrated with a splash shield 210 cut away. Splash shield 210 is illustrated in FIG. 2. The set of conveyance alignment guides 112, also shown in FIG. 2, forms a set of sub-apertures 502A-502G across mouth 108. Sub-apertures 502A-502G are indicated in FIG. 5 for improved clarity, and are illustrated as having non-identical widths. Conveyance alignment guides 112A-G align transverse conveyances, including ribbon cables 110 and wire 114, in clamp 106. In the illustrated embodiment, conveyance alignment guide 112A and 112B restrict motion of ribbon cables 110, and conveyance alignment guide 112F restricts motion of wire 114. In some embodiments, sub-apertures 502A-502G are sized such that the insulation or other external housings of transverse conveyances effectively blocks out contaminants, forming a seal. For example, if gaps between the outside of wire 114 and the interior of sub-aperture 402G are small enough, contaminants are unlikely to pass through the gaps and into the inside of enclosure 100. Thus, for some embodiments, the set of conveyance alignment guides 112 may form a sealing layer for clamp 106. Grommets and/or other flexible sealing material, such as room temperature vulcanizing (RTV) rubber, around transverse conveyances may provide further sealing.

In FIG. 1, clamp 106 is also illustrated as comprising flexible layers 116 and 118, which also form sealing layers. In some embodiments flexible layer 116 and/or flexible layer 118 comprise foam rubber, although other compressible materials may be used. When assembled with ribbon cables 110 and wire 114 in place, flexible layers 116 and 118 compress and conform to the shapes and sizes of the transverse conveyances. For example, flexible layers 116 and 118 form a seal 119 to prevent contaminants from entering enclosure 100, even when ribbon cables 110 and wire 114 pass through mouth 108 of clamp 106. It should be understood that flexible layers 116 and 118 are able to form the seal 119 even where ribbon cables 110 and wire 114 have differing diameters, or have been moved from one of sub-apertures 502A-502G to another. Thus, the illustrated embodiment of enclosure 100 comprises at least three sealing layers: the set of conveyance alignment guides 112, flexible layer 116 and flexible layer 118. However, it should be understood that some embodiments may comprise a greater or lesser quantity of sealing layers.

As illustrated, the set of conveyance alignment guides 112 is able to deflect contaminants from at least a portion of flexible layers 116 and 118, thereby forming a protective shield for flexible layers 116 and 118. In some embodiments, flexible layers 116 and 118 are constructed with materials that may degrade with age, exposure to contaminants, and repeated opening and closing of clamp 106. The protective nature of conveyance alignment guides 112A-G can extend the lifespan of flexible layers 116 and 118. Further, to ensure durability, some embodiments of enclosure 100 use replaceable flexible layers 116 and 118.

FIG. 2 illustrates an exploded assembly view of enclosure 100. In the illustrated embodiment, splash shield 210 is attached to top clamp portion 106A, although it should be understood that splash shield 210 may be a separate piece, coupleable to enclosure 100. Splash shield 210 obscures at least a portion of mouth 108 of clamp 106 to deflect contaminants away from mouth 108, further protecting flexible layers 116 and 118. An adhesive strip 208 is illustrated on flexible layer 116, which affixes flexible layer 116 to clamp top portion 106A. Another adhesive strip 208 on the underside of flexible layer 118 affixes flexible layer 118 to bottom clamp portion 106B. In the illustrated embodiment, when flexible layer 116 or 118 becomes worn, it may be replaced by pulling it out and affixing the replacement layer 116 or 118 in place using adhesive strip 208.

Base 102 comprises a conveyance aperture 212, which permits ribbon cables 110 and wire 114 to traverse enclosure 100, passing from the inside to the outside. Aperture 212 is configured to be offset from mouth 108 of clamp 106, illustrated as aperture 212 being vertically offset and below the expected location of mouth 108, when clamp 106 is assembled. It should be understood, however, that a different offset, such as a horizontal or diagonal offset, may be used. Ribbon cables 110 and wire 114 are illustrated as bent as they would be when enclosure 100 is assembled. It can be seen in FIG. 2 that the relative positions and orientations of aperture 212, clamp 106 and splash shield 210 force ribbon cables 110 and wire 114 through a curved path, having a total bend of greater than 90 degrees, although this total bend is comprised of multiple bends, each of which may be less than 90 degrees. This curved path further protects the inside of enclosure 100 from the likelihood of contamination through aperture 212. Aperture 212 is therefore sealed against contaminants by clamp 106.

The illustrated embodiment of enclosure 100 further comprises a gasket 206, illustrated as a compressible, replaceable ring, although other embodiments may comprise different removable and/or permanent gasket types. Gasket 206 is compressed between mating surfaces 202 and 204 on base 102 and cover 104, respectively. Mating surfaces 202 and 204 are illustrated as continuous, having no gaps or notches for transverse conveyances. Mating surfaces 202 and 204 are configured to form a seal in order to keep contaminants out of enclosure 100 when cover 104 and base 102 are coupled together. In the illustrated embodiment, mating surface 202 comprises a channel 202A, which is configured to retain gasket 206 in place during assembly.

Figure 3:
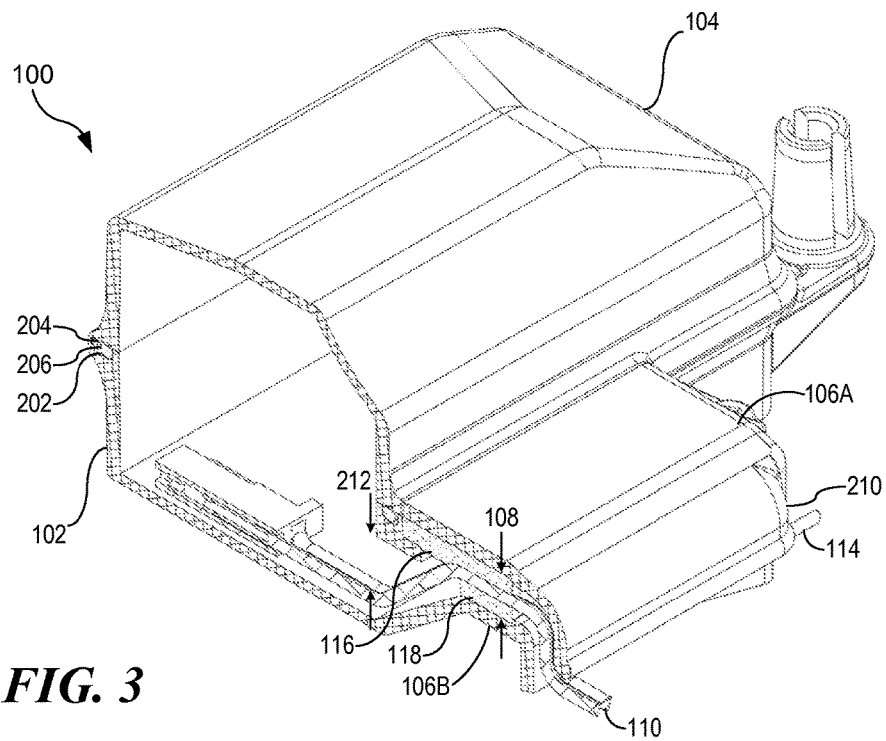
FIG. 3 illustrates a cutaway perspective view of the protective enclosure of FIG. 1.

FIG. 3 illustrates a cutaway perspective view of enclosure 100, as assembled. A ribbon cable 110 is illustrated traversing enclosure 100, bending more than 90 degrees as it passes through aperture 212, mouth 108 of clamp 106, which is offset from aperture 212, and beneath splash shield 210. Mating surfaces 202 and 204 are illustrated forming a seal that includes gasket 206.

Figure 4:
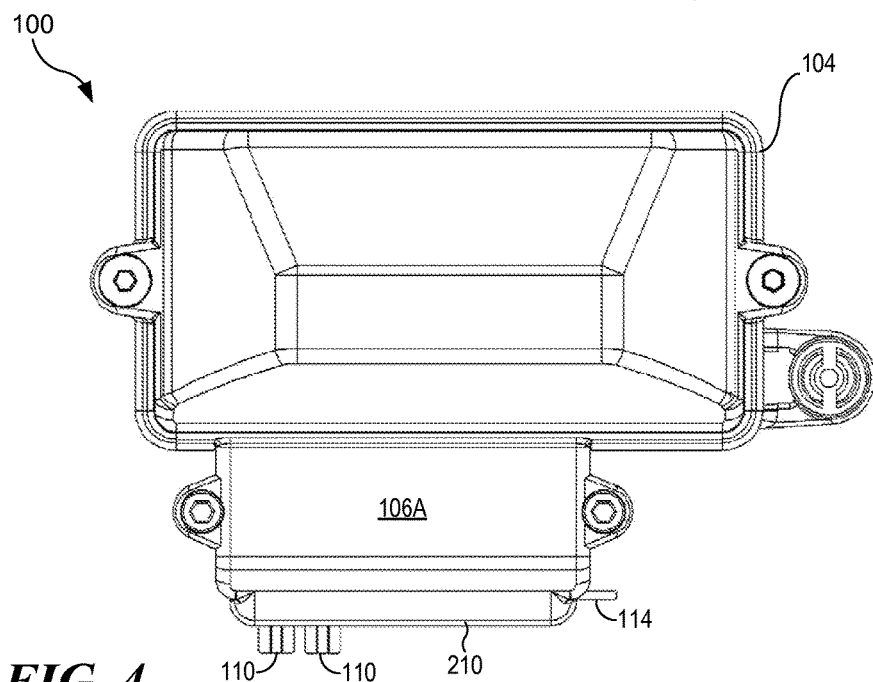
FIG. 4 illustrates a top view of the protective enclosure of FIG. 1.

FIG. 4 illustrates a top view of enclosure 100, as assembled, with ribbon cables 110 and wire 114 traversing enclosure 100. FIG. 5 illustrates a cutaway top view of enclosure 100, showing the interior of base 102, with cover 104 and top clamp portion 106A removed. Sub-apertures 502A-G, formed adjacent to mouth 108 of clamp 106 by the set of conveyance alignment guides 112, are identified. Ribbon cables 110 and wire 114 are illustrated passing above flexible layer 118.

Figure 6:
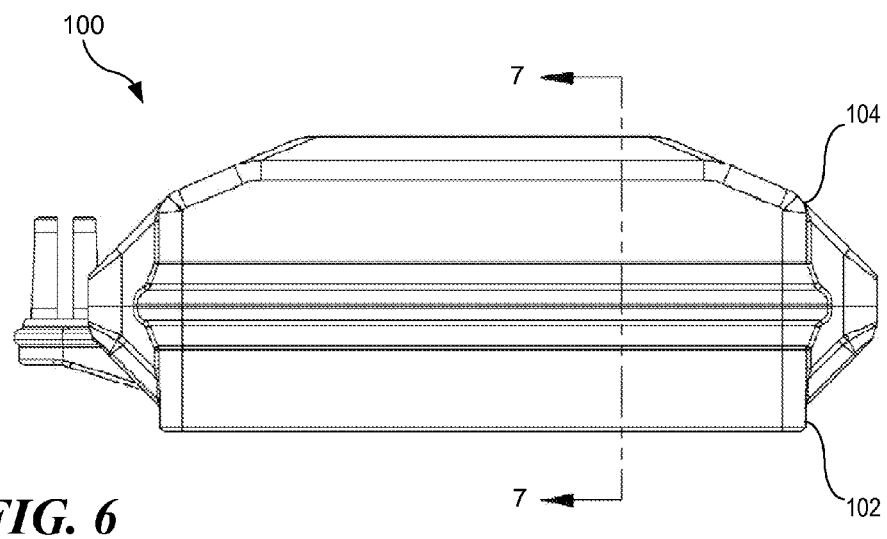
FIG. 6 illustrates a rear view of the protective enclosure of FIG. 1.
Figure 7:
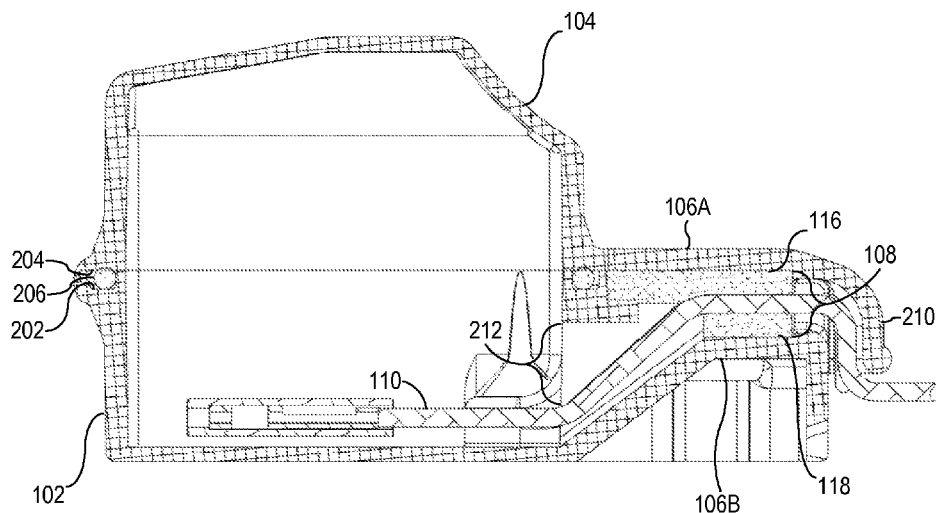
FIG. 7 illustrates a cutaway side view of the protective enclosure of FIG. 1.

FIG. 6 illustrates a rear view of enclosure 100, indicating plane 7 used for the cutaway side view of FIG. 7. In FIG. 7, enclosure 100 is illustrated as assembled, with ribbon cables 110 passing through aperture 212, disposed between flexible layers 116 and 118, and bending downward to pass out of mouth 108 and past splash shield 210.

Figure 8:
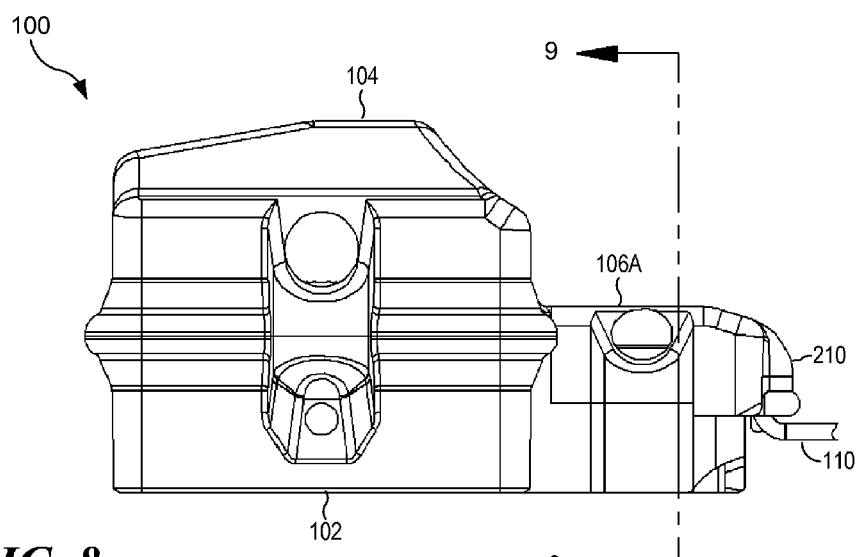
FIG. 8 illustrates a side view of the protective enclosure of FIG. 1.
Figure 9:
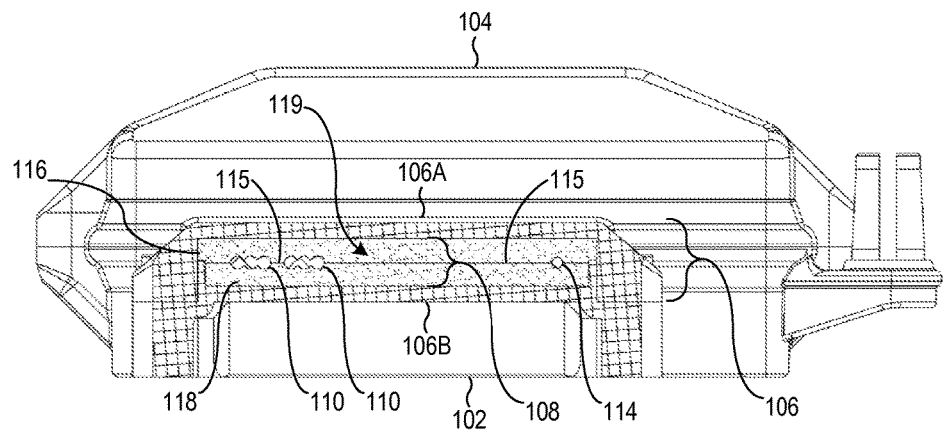
FIG. 9 illustrates a cutaway front view of the protective enclosure of FIG. 1.

FIG. 8 illustrates a side view of enclosure 100, indicating plane 9 used for the cutaway front view of FIG. 7. Plane 9 is between splash shield 210 and base 102. In FIG. 9, ribbon cables 110 and wire 114 are illustrated as passing between flexible layers 116 and 118. Flexible layers 116 and 118 of the seal 119 compress to conform to the shapes and sizes of ribbon cables 110 and wire 114, sealing gaps 115 in order to protect the interior of enclosure 100 from contaminants.

Figure 11:
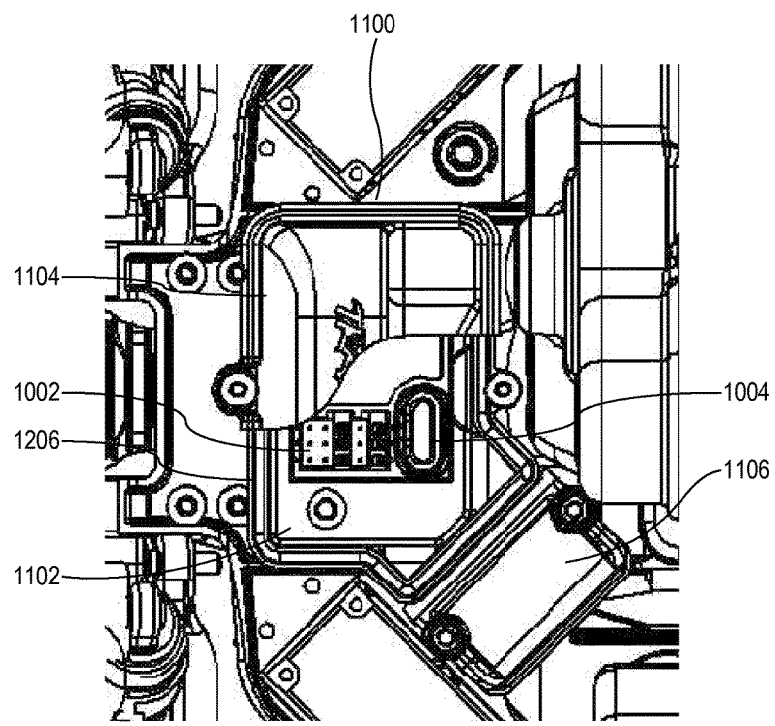
FIG. 11 illustrates a cutaway view of the protective enclosure of FIG. 10.
Figure 10:
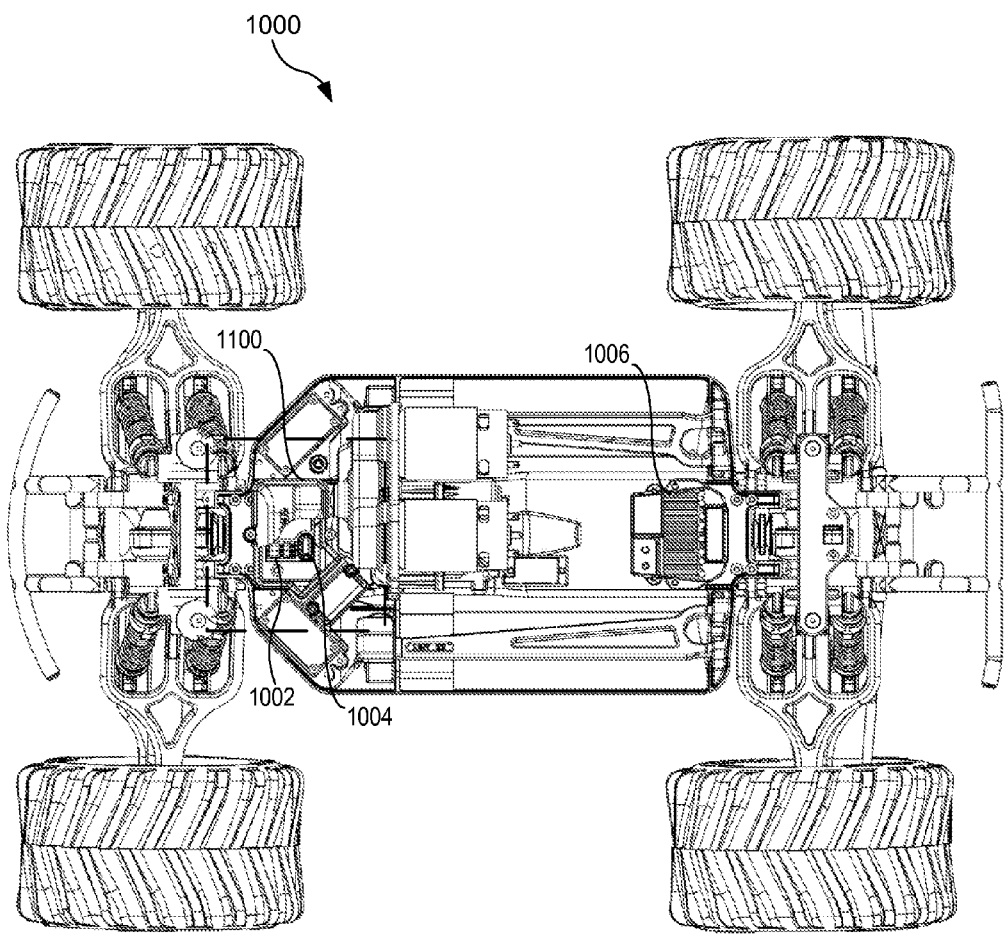
FIG. 10 illustrates an embodiment of a remotely controllable car comprising another embodiment of a protective enclosure.

FIG. 10 illustrates an embodiment of a remotely controllable car 1000 with another embodiment of a protective enclosure 1100. Remotely controllable car 1000 also comprises a drive train 1006, which is controlled by control devices 1002 and 1004 inside enclosure 1100. FIG. 11 illustrates a close-up cutaway view of enclosure 1100, which comprises a base 1102, a cover 1104, a gasket 1206 and a clamp 1106. It should be understood that remotely controllable car 1000 may comprise multiple protective enclosures 100 and/or 1100. It should be further understood that control devices 1002 and 1004 may be electronic, mechanical and/or electromechanical modules, and that a greater or lesser quantity may be used.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A protective enclosure for a model vehicle, comprising:
    a lower enclosure portion comprising at least one conveyance aperture, the conveyance aperture configured for passage of one or more conveyances through the conveyance aperture from within the lower enclosure portion and wherein at least a portion of the conveyance aperture comprises an aperture perimeter defined by one or more walls of the lower enclosure portion;
    one or more conveyances, the one or more conveyances having a length extending from a conveyance origin within the enclosure to a conveyance terminus outside the enclosure;
    an upper enclosure portion coupleable to the lower enclosure portion, the upper enclosure portion comprising a continuous sealing surface;
    at least one flexible enclosure seal cooperating with the continuous sealing surface of the upper enclosure portion to form a continuous seal about the upper enclosure portion and at least a portion of the lower enclosure portion, wherein the at least one flexible enclosure seal is disposed along the continuous mating surface of the upper enclosure portion;
    a clamp comprising a clamp mouth having a lower mouth portion extending outwardly from the lower enclosure portion, the lower mouth portion comprising a lower clamping surface, and an upper mouth portion extending outwardly from the upper enclosure portion, the upper mouth portion comprising an upper clamping surface, wherein the lower and upper clamping surfaces cooperate to clamp at least a portion of the one or more conveyances between the clamping surfaces;
    wherein at least a portion of the lower or upper clamping surface of the clamp mouth is disposed outside of an area within the aperture perimeter and along at least a portion of the length of the one or more conveyance closer to the conveyance terminus than the aperture perimeter, and wherein at least a portion of the lower or upper clamp surface disposed outside of the area within the aperture perimeter compresses at least a portion of the one or more conveyances;
    wherein at least one of the one or more conveyances comprise one or more wires separated from immediate surroundings and preventing passage of contaminants past or between the one or more wires by electrical insulation material encasing the one or more wires; and
    a clamp seal having at least a portion compressed between the lower and upper clamping surfaces, and wherein the clamp seal conforms around at least a portion of opposite sides of the one or more conveyances.

2. An electronics enclosure for a model vehicle, comprising:
    a first enclosure member;
    a second enclosure member, the second enclosure member comprising a sealing surface;
    wherein the first and second enclosure members mate to form the enclosure, the enclosure comprising the first enclosure member mating with the sealing surface of the second enclosure member to form the enclosure;
    a conveyance port through at least a portion of a wall of the first enclosure member;
    at least one conveyance, wherein the at least one conveyance comprises one or more wires separated from immediate surroundings and preventing passage of contaminants past or between the one or more wires by electrical insulation material encasing the one or more wires;
    one or more conveyance seals, the one or more conveyance seals comprising a first sealing surface and a second sealing surface, the first and second sealing surfaces movable between a first position to grip and conform around opposite sides of the at least one conveyance to restrict the passage of contaminants and a second position to release the one or more conveyances;
    the at least one conveyance extending through the conveyance port and between the first and second sealing surfaces of the one or more conveyance seals;
    enclosure seal material disposed between the first enclosure member and the sealing surface of the second enclosure member, the enclosure seal material comprising a deformable material forming a substantially continuous seal about the formed enclosure and configured to restrict passage of contaminants into the enclosure between the first and second enclosure members when the first and second enclosure members are mated to form the enclosure;
    the one or more conveyance seals configured to restrict passage of contaminants past the at least one conveyance and through the conveyance port; and
    at least a portion of the second enclosure member when mated to the first enclosure member at least partially secures the at least one conveyance seal against being moved from the first position wherein the first and second sealing surfaces conform around opposite sides of the at least one conveyance to restrict the passage of contaminants.

3. The electronics enclosure for a model vehicle of claim 2, wherein at least a portion of the second enclosure member is configured to allow the one or more conveyance seals to be moved from the first position to the second position when the second enclosure member is not mated with the first enclosure member.

4. The electronics enclosure for a model vehicle of claim 2, wherein at least a portion of the second enclosure member is configured to allow removal of the one or more conveyances from between the first and second sealing surfaces of the one or more conveyance seals when the second enclosure member is not mated with the first enclosure member.

5. The electronics enclosure for a model vehicle of claim 2, wherein the at least one conveyance extends through the conveyance port from within the enclosure formed by the mated first and second enclosure members and the at least one conveyance extends between the first and second sealing surfaces disposed in the first position.

6. The electronics enclosure for a model vehicle of claim 2, wherein at least a portion of the second enclosure member is configured to at least partially engage and secure at least a portion of the one or more conveyance seals in the first conveyance seal position when the second enclosure member mates with the first enclosure member.

7. The electronics enclosure for a model vehicle of claim 2, wherein at least a portion of the second enclosure member is configured to at least partially engage and secure the at least one conveyance against removal from the one or more conveyance seals when the second enclosure member mates with the first enclosure member.

8. The electronics enclosure for a model vehicle of claim 2, wherein the substantially continuous seal is formed between the first and second enclosure members when the first and second enclosure members are mated.

9. The electronics enclosure for a model vehicle of claim 2, wherein the enclosure seal material comprises a seal member disposed continuously around the perimeter of the enclosure, between the first and second enclosure members, and continuously along the sealing surface of the second enclosure member.

10. The electronics enclosure for a model vehicle of claim 9, wherein the at least one conveyance comprises a wire ribbon.

11. The electronics enclosure for a model vehicle of claim 9, wherein:
the enclosure sealing member further comprises a loop of compressible material.

12. The electronics enclosure for a model vehicle of claim 2, wherein the at least one conveyance comprises two or more wires, the two or more wires separated from immediate surroundings and preventing passage of contaminants past or between the wires by electrical insulation material encasing the wires, and wherein at least two of the two or more wires are not encased within a shared piece of electrical insulation material.

13. The electronics enclosure for a model vehicle of claim 2, further comprising:
the second enclosure member comprising a shielding portion, the shielding portion extending outwardly from the enclosure adjacent the one or more conveyance seals to deflect debris from the at least one conveyance.

14. The protective enclosure for a model vehicle of claim 2, wherein the at least one conveyance comprises a first conveyance and a second conveyance, and wherein different portions of the first and second sealing surfaces of the at least one conveyance seal conform around the first and a second conveyances.

15. The protective enclosure for a model vehicle of claim 14, wherein at least the portion of the first sealing surface and the portion of the second sealing surface positioned between the first conveyance and the second conveyance of the plurality of conveyances abut together to restrict the passage of contaminants past the abutted portions of the first and second sealing surfaces.

16. The protective enclosure for a model vehicle of claim 2, wherein at least a portion of the first sealing surface and at least a portion of the second sealing surface are substantially parallel to each other.

17. A protective enclosure for a model vehicle, comprising:
a lower enclosure portion comprising at least one conveyance aperture, the conveyance aperture configured for passage of one or more conveyances through the conveyance aperture from within the lower enclosure portion and wherein at least a portion of the conveyance aperture comprises an aperture perimeter defined by one or more walls of the lower enclosure portion;
one or more conveyances, the one or more conveyances having a length extending from a conveyance origin within the enclosure to a conveyance terminus outside the enclosure;
an upper enclosure portion coupleable to the lower enclosure portion, the upper enclosure portion comprising a continuous sealing surface;
a clamp comprising a clamp mouth having a first mouth portion comprising a first clamping surface and comprising a second mouth portion comprising a second clamping surface, wherein the first and second clamping surfaces cooperate to clamp at least a portion of the one or more conveyances between the clamping surfaces;
wherein at least a portion of each of the first and second clamping surfaces of the clamp mouth is disposed a distance from an area within the aperture perimeter and along at least a portion of the length of the one or more conveyances, and wherein at least a portion of the first and second clamp surfaces disposed a distance from the area within the aperture perimeter compresses at least a portion of the one or more conveyances;
wherein at least one of the one or more conveyances comprise one or more wires separated from immediate surroundings and preventing passage of contaminants past or between the one or more wires by electrical insulation material encasing the one or more wires; and
a clamp seal having at least a portion compressed between the first and second clamping surfaces, and wherein the clamp seal conforms around at least a portion of opposite sides of the one or more conveyances.

18. The protective enclosure for a model vehicle of claim 17, further comprising:
at least one flexible enclosure seal cooperating with the continuous sealing surface of the upper enclosure portion to form a continuous seal about the upper enclosure portion and the lower enclosure portion, wherein the at least one flexible enclosure seal is disposed along the continuous sealing surface of the upper enclosure portion.

* * * * *